US007406144B2

United States Patent
Wang

(10) Patent No.: US 7,406,144 B2
(45) Date of Patent: Jul. 29, 2008

(54) CLOCK GENERATOR CIRCUIT USING PHASE MODULATION TECHNOLOGY AND METHOD THEREOF

(75) Inventor: Ping-Ying Wang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 708 days.

(21) Appl. No.: 10/820,500

(22) Filed: Apr. 7, 2004

(65) Prior Publication Data

US 2004/0247027 A1    Dec. 9, 2004

(30) Foreign Application Priority Data

Jun. 3, 2003    (TW) .............................. 92115156 A

(51) Int. Cl.
*H03D 3/24* (2006.01)
(52) U.S. Cl. .................. 375/376; 375/346; 375/371; 375/149; 332/127; 381/100; 327/158
(58) Field of Classification Search ................. 375/346, 375/371, 149; 332/127; 381/100; 327/158
See application file for complete search history.

(56) References Cited

U.S. PATENT DOCUMENTS

| 5,903,194 A * | 5/1999 | Opsahl et al. ................ 331/1 A |
| 6,559,698 B1 * | 5/2003 | Miyabe ....................... 327/157 |
| 6,876,710 B1 * | 4/2005 | Pitzer et al. .................. 375/371 |
| 7,079,616 B2 * | 7/2006 | Castiglione et al. ......... 375/376 |
| 2002/0171457 A1 * | 11/2002 | Fujiwara ....................... 327/113 |
| 2004/0001600 A1 * | 1/2004 | Kim et al. .................... 381/100 |

* cited by examiner

*Primary Examiner*—Shuwang Liu
*Assistant Examiner*—Kabir A Timory
(74) *Attorney, Agent, or Firm*—Winston Hsu

(57) ABSTRACT

A clock generator circuit, comprising: a multi-phase clock signal generator for generating a plurality of clock signals having a same frequency but difference phases according to a reference clock signal; a modulation device for generating a phase modulation signal through Delta-Sigma modulation; and a phase modulator, which is electrically coupled to the modulation device, for selecting one of the clock signals to be a modulated clock signal according to the phase modulation signal.

17 Claims, 9 Drawing Sheets

CLOCK GENERATOR CIRCUIT USING PHASE MODULATION TECHNOLOGY AND METHOD THEREOF

This application claims the benefit of Taiwan application Ser. No. 092115156, filed Jun. 3, 2003, the subject matter of which is incorporated herein by reference.

BACKGROUND OF THE INVENTION

1. Field of the Invention

The invention relates to a clock generator circuit and a method thereof, and more particularly to a clock generator circuit using phase modulation technology and a method thereof.

2. Description of the Related Art

Spread spectrum can reduce energy having a converged frequency and thus decrease the electromagnetic interference on other electrical devices. FIG. 1 is a schematic block diagram showing a spread spectrum circuit using a phase-locked loop (PLL). The PLL includes a phase frequency detector (PFD) 11, a charge pump 12, a loop filter 13, a voltage controlled oscillator (VCO) 14, and a divider 15. The spread spectrum circuit in the conventional PLL is configured such that a modulation signal is applied to a connection between the charge pump 12 and the loop filter 13 in order to change the output voltage of the loop filter 13 (i.e., the control voltage of the VCO 14) and thus the output clock frequency of the VCO 14, thereby achieving the object of spread spectrum.

When the modulation signal is not applied to the PLL, the VCO 14 is configured to generate an output clock having the frequency which is N times that of a reference clock. The output clock generated by the VCO 14 is divided by the divider 15, and then compared to the reference clock in the PFD 11. The comparison result determines whether the current source in the charge pump 12 absorbs or outputs current. Thus, the charges flow into or out of the capacitor of the loop filter 13, thereby influencing the output voltage of the loop filter 13, wherein the number of charges is directly proportional to the phase difference of the comparison result. Because the loop filter 13 is electrically coupled to the VCO 14, the control voltage of the VCO 14 and thus the output clock frequency thereof change as the output voltage of the loop filter 13 changes. Thus, the frequency difference between the output clock frequency and the reference clock is reduced. When the output clock approximates N times of the reference clock, the feedback operation of the PLL enables the VCO 14 to lock the reference clock. Once the VCO 14 locks the reference clock, the output clock frequency is substantially the same as N times of the reference clock frequency except for some phase differences.

Consequently, when the modulation signal is not applied, the output voltage of the loop filter 13 is a constant value while the output clock of the VCO 14 has a constant frequency. However, in order to achieve the object of spread spectrum, the modulation signal is applied to the connection between the charge pump 12 and the loop filter 13. The modulation signal is for interfering with the input voltage of the loop filter 13 in order to change the output voltages of the charge pump 12 and the loop filter 13, and thus the control voltage of the VCO 14. The waveforms at points A and B of FIG. 1 are shown in FIGS. 2A and 2B, respectively, wherein point A is an input terminal of the VCO 14 and point B is an output terminal of the VCO 14. As shown in the drawings, because the modulation signal is added, the voltage value at the input terminal (point A) of the VCO 14 is changing such that its output clock frequency is also changing therewith, and the object of spread spectrum may be achieved.

However, the conventional spread spectrum method performed by applying the modulation signal to the PLL has the following drawbacks.

1. Because the loop bandwidth of the PLL is smaller than the frequency of the modulation signal, the area of the capacitor in the loop filter 13 has to be enlarged, and thus the volume of the circuit device is also enlarged.

2. The conventional method can only perform the center spread spectrum but cannot perform the down spread spectrum. In general, the condition of the up spread spectrum may have the problem that the speeds of other devices in the system are not sufficiently high, but the condition of the down spread spectrum is usually free from the problem of insufficient speed.

3. Because the loop bandwidth of the PLL is too small, the waveform of the output clock of the VCO 14 turns into a quasi-sine wave, as shown in FIGS. 3A and 3B, wherein its ideal frequency spectrum and actual frequency spectrum are illustrated in FIGS. 4A and 4B. As shown in the drawings, because the energy is converged in $f_1$ and $f_2$, the curve of the actual frequency spectrum cannot be a smoother curve, and the associated requirement and specification for the electromagnetic interference also cannot be met.

SUMMARY OF THE INVENTION

It is therefore one of the objects of the invention to provide a phase lock loop circuit using phase modulation technology, wherein a modulation signal does not have to be used in the PLL of the circuit, so the capacitor area of the loop filter in the PLL does not have to be enlarged and the size of the circuit device may be effectively reduced.

Another object of the invention is to provide a spread spectrum circuit and method using phase modulation technology, wherein the method can be widely applied because it is adapted to not only the center spread spectrum but also the down spread spectrum.

Still another object of the invention is to provide a spread spectrum circuit and method using phase modulation technology, wherein the loop bandwidth of the PLL of the circuit is large, so there is no problem of seriously converged energy and the curve in the frequency spectrum chart may be smoother.

The invention achieves the above-identified objects by providing a clock generator circuit, comprising: a multi-phase clock signal generator for generating a plurality of clock signals having a same frequency but difference phases according to a reference clock signal; a modulation device for generating a phase modulation signal through Delta-Sigma modulation; and a phase modulator, which is electrically coupled to the modulation device, for selecting one of the clock signals to be a modulated clock signal according to the phase modulation signal.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
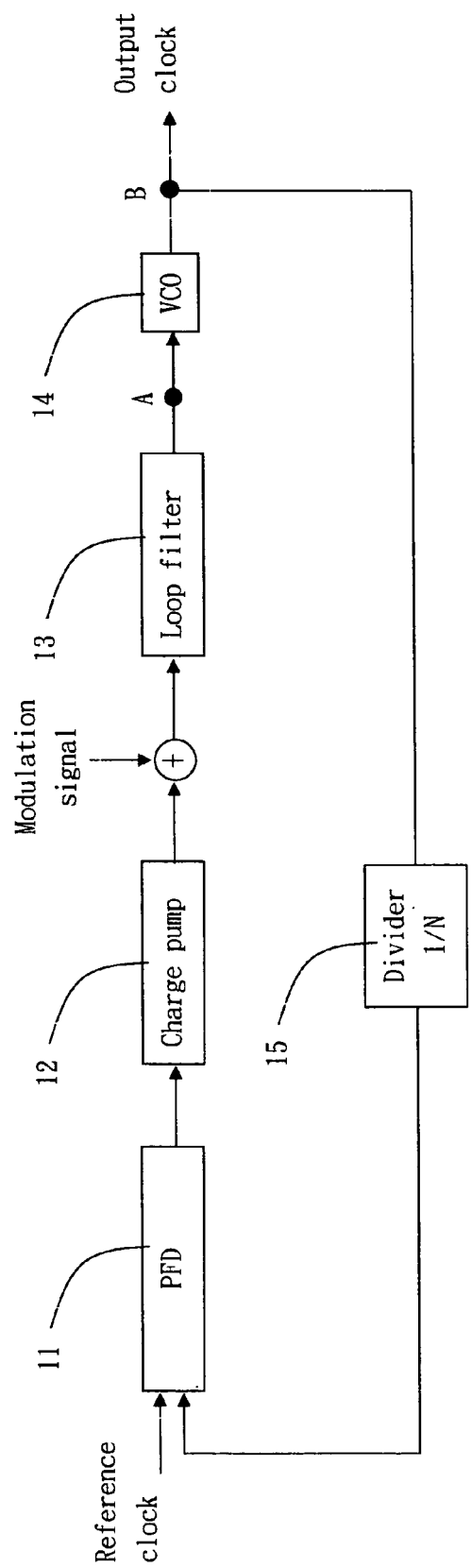
FIG. 1 is a schematic block diagram showing a spread spectrum circuit using a phase-locked loop.
Figure 2A:
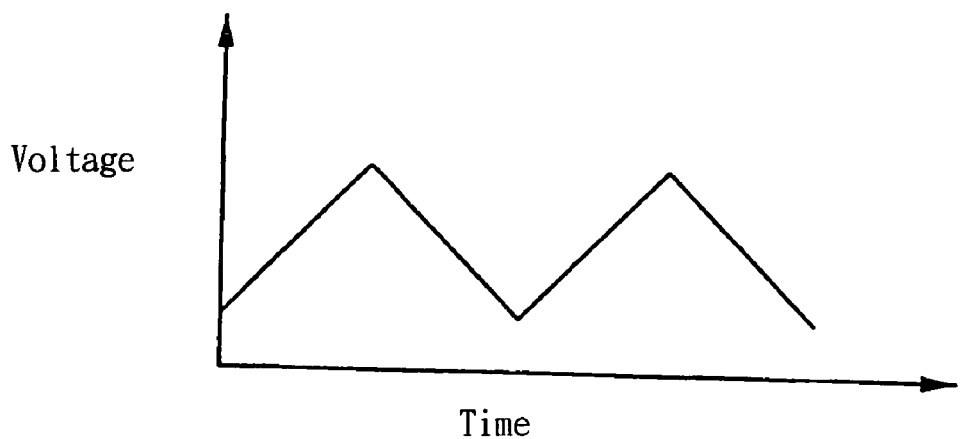
FIG. 2A shows a waveform at point A of FIG. 1.
Figure 2B:
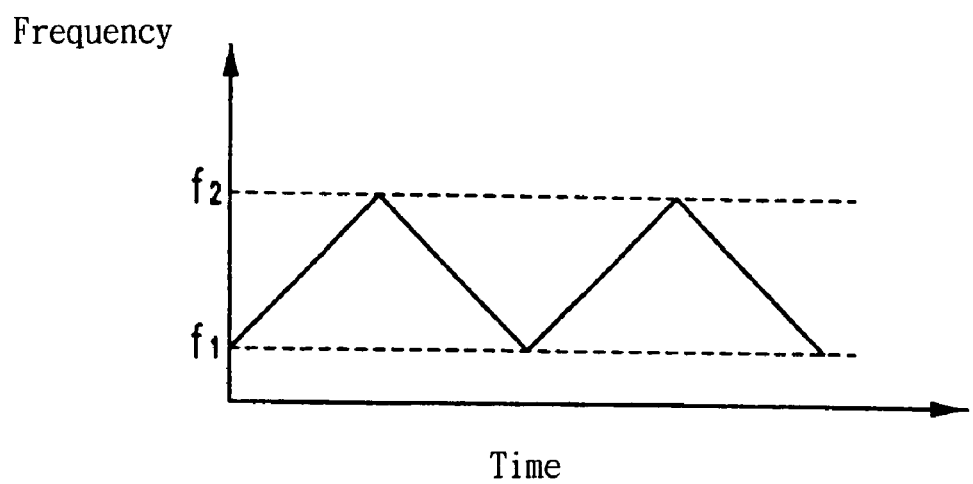
FIg. 2B shows a waveform at point B of FIG. 1.
Figure 3A:
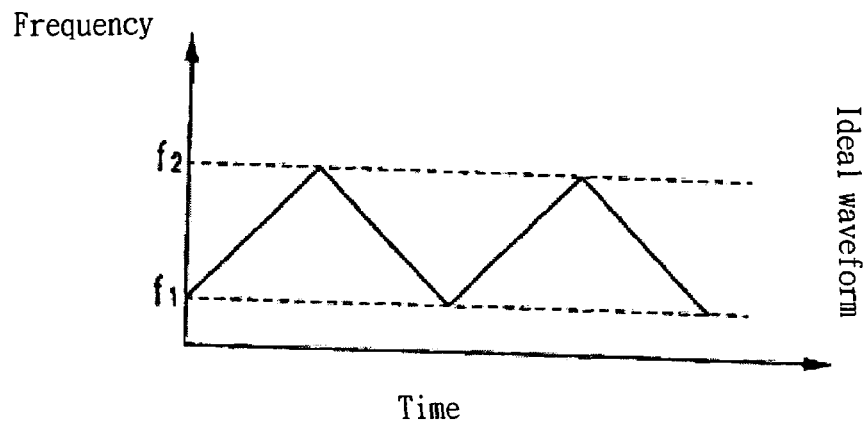
FIG. 3A shows an ideal output waveform of the circuit of FIG. 1.
Figure 3B:
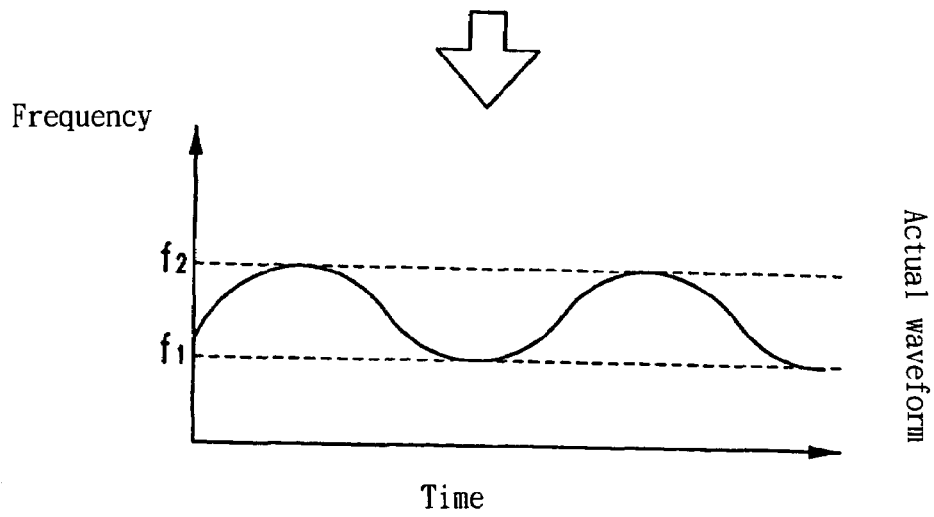
FIG. 3B shows an actual output waveform of the circuit of FIG. 1.
Figure 4A:
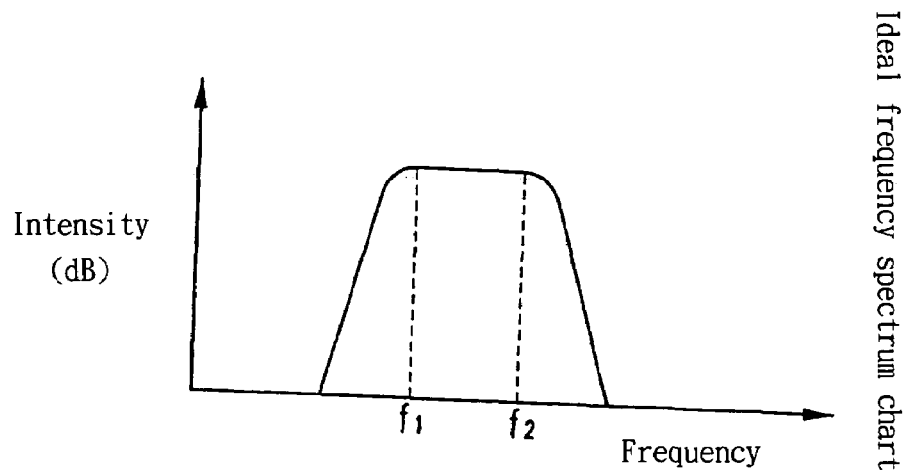
FIG. 4A shows an ideal frequency spectrum of the circuit of FIG. 1.
Figure 4B:
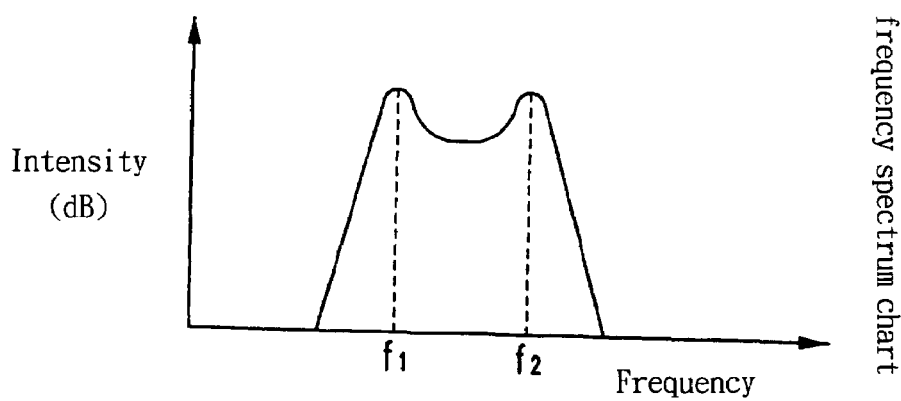
FIG. 4B shows an actual frequency spectrum of the circuit of FIG. 1.
Figure 5A:
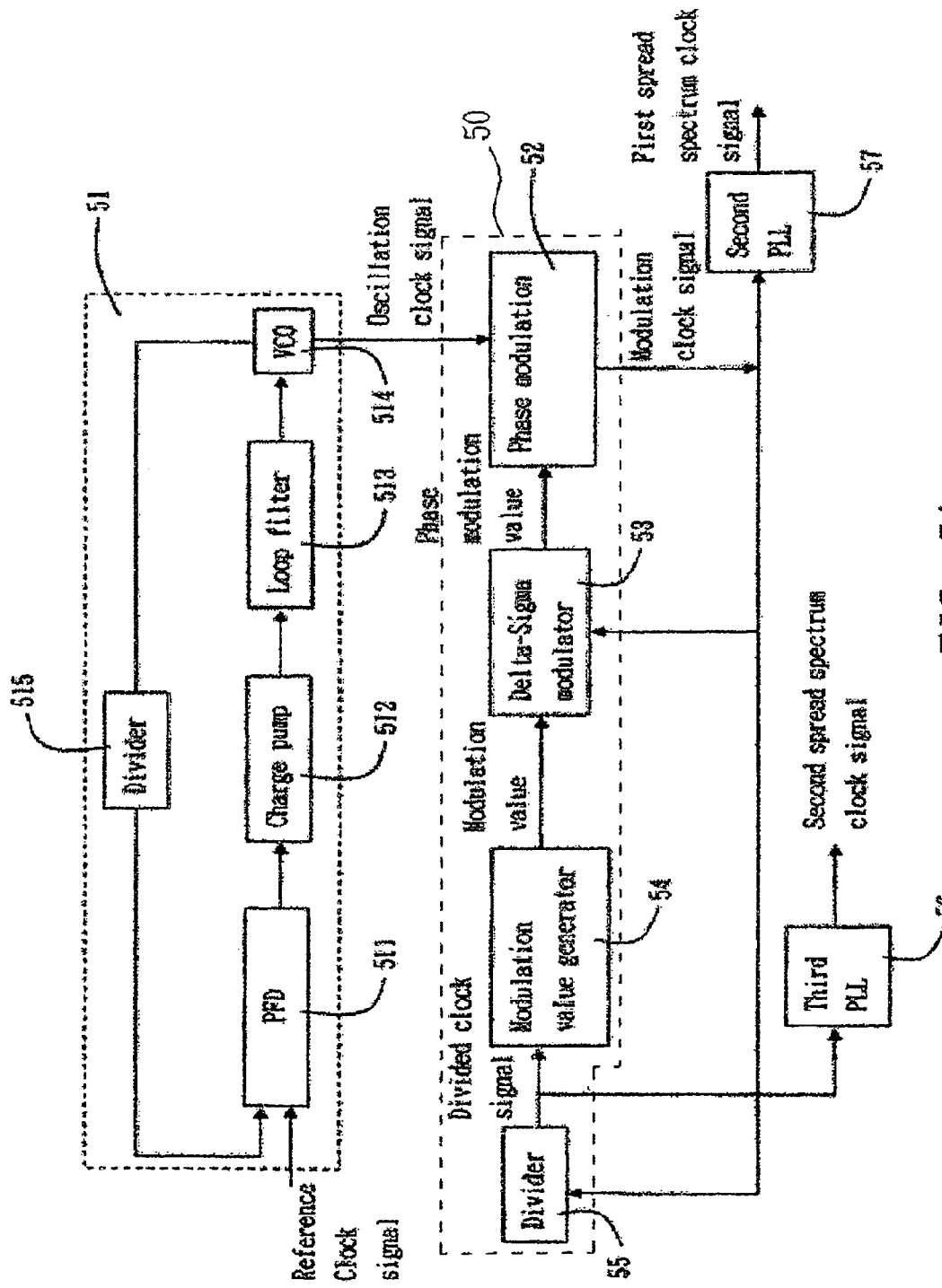
FIG. 5A is a block diagram showing a spread spectrum circuit using phase modulation technology according to an embodiment of the invention.

FIG. 5A is a block diagram showing a spread spectrum circuit using phase modulation technology according to an embodiment of the invention. The circuit includes a multi-phase oscillation clock generator 51, and a spread spectrum control circuit 50 comprising a modulation value generator 54, a Delta-Sigma modulator 53, a phase modulator 52, a divider 55, and a second phase-locked loop (PLL) 57. The multi-phase oscillation clock generator 51 may be a phase-locked loop (PLL), which is composed of a phase frequency detector (PFD) 511, a charge pump 512, a loop filter 513, a voltage controlled oscillator (VCO) 514, and a divider 515.

Figure 6:
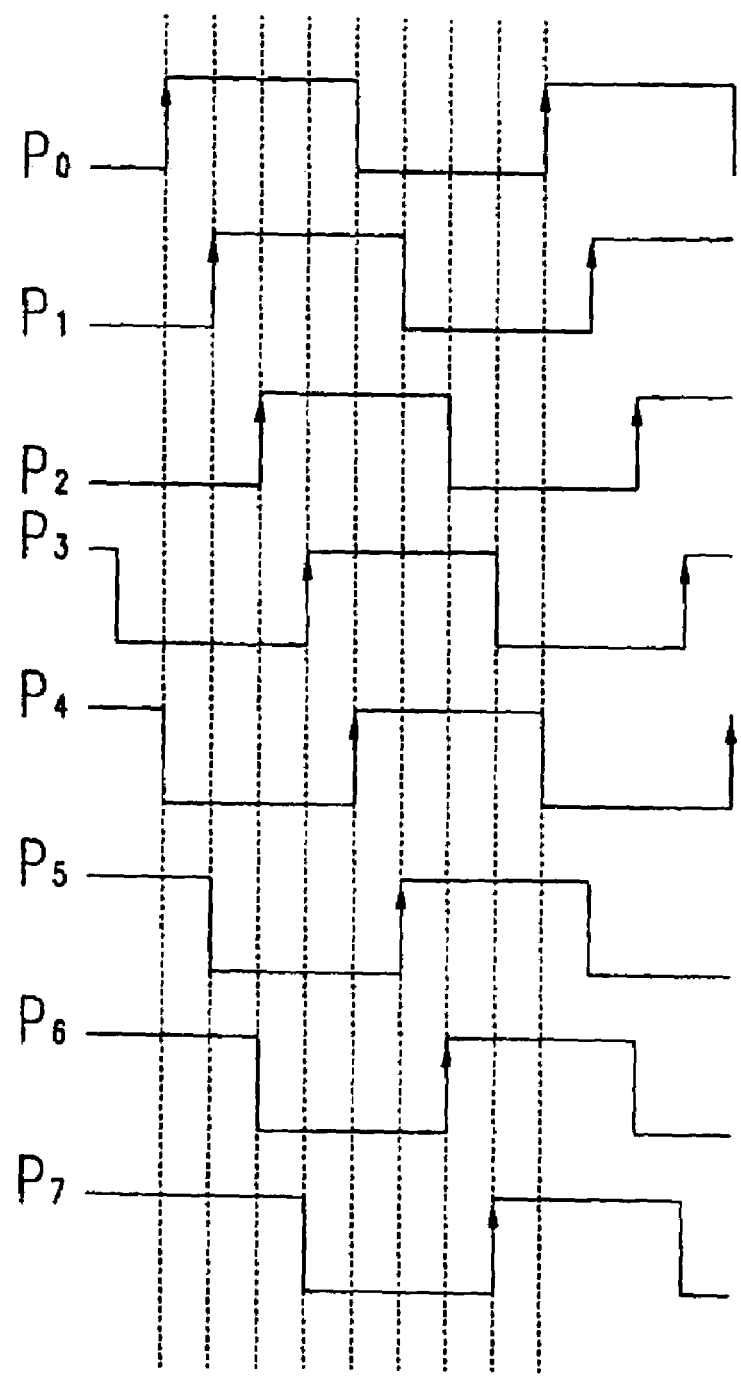
FIG. 6 shows a waveform of an oscillation clock signal of the circuit of FIG. 5.

The multi-phase oscillation clock generator 51 receives a reference clock signal and outputs a plurality of oscillation clock signals having the same frequency but different phases, and the waveforms of the signals are shown in FIG. 6. In the waveforms of FIG. 6, it is assumed that the oscillation clock signals have eight phases ($P_0$ to $P_7$) in one clock cycle. As shown in FIG. 6, the oscillation clock signals have the same frequency but slightly different phases. The modulation value generator 54 is for generating a modulation value. The Delta-Sigma modulator 53 electrically coupled to the modulation value generator 54 is for generating a phase modulation value in response to the modulation value. The phase modulator 52 electrically coupled to the multi-phase oscillation clock generator 51 receives the oscillation clock signals, and generates a modulation clock signal by selecting the phase (advance phase or delay phase) according to a phase modulation value generated by the Delta-Sigma modulator 53.

Figure 5B:
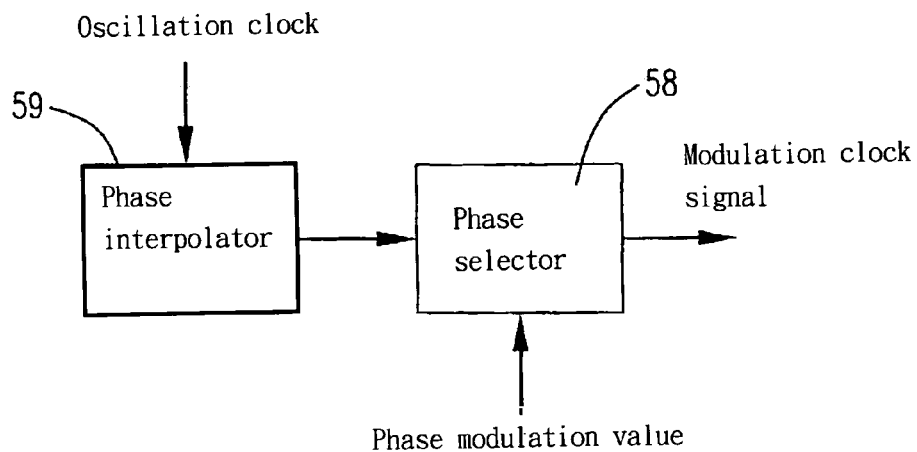
FIG. 5B is a block diagram showing a circuit of a phase modulator according to the embodiment of the invention.
Figure 5C:
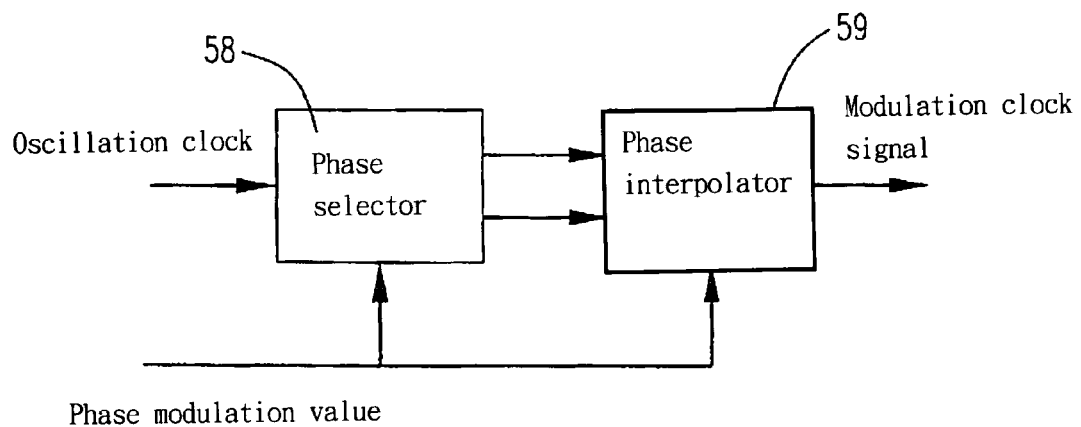
FIG. 5C is a block diagram showing a circuit of a phase modulator according to another embodiment of the invention.

Referring to FIG. 5B, the phase modulator 52 includes a phase interpolator 59 for receiving the oscillation clock signal and performing the phase interpolating for output so as to obtain the modulation clock signals having more phases and the phase selector 58 selects one of the phases and outputs a modulation clock signal. Referring to FIG. 5C, which shows another embodiment of the phase modulator 52, the phase modulator 52 includes a phase interpolator 59 and a phase selector 58. The phase selector 58 receives the oscillation clock signals and selects two adjacent oscillation clock signals for output. The phase interpolator 59 receives the two adjacent oscillation clock signals, performs the phase interpolation, and then outputs the modulation clock signal according to these two adjacent oscillation clock signals.

Figure 7A:
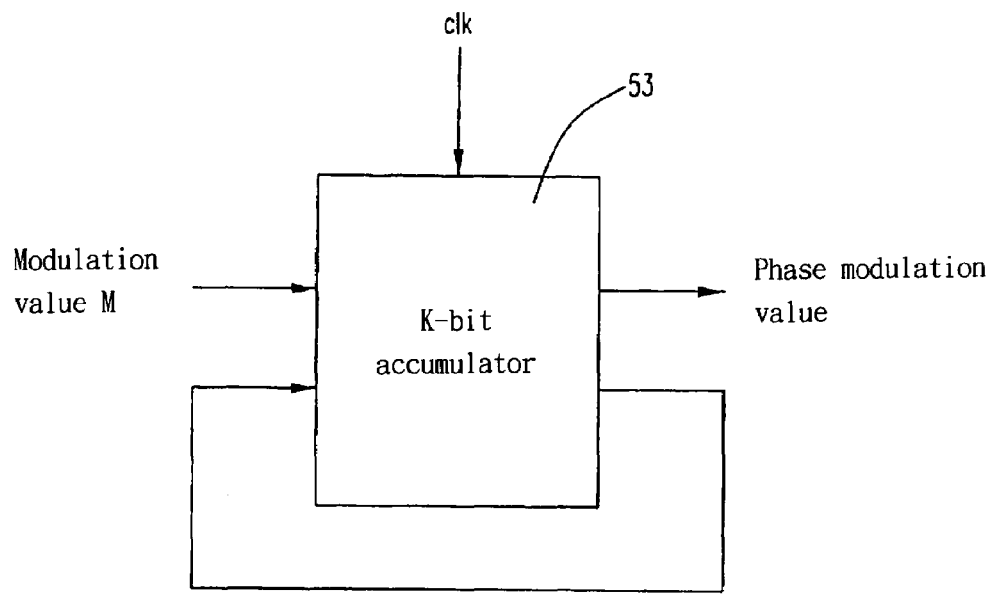
FIG. 7A is a diagram showing a circuit of a Delta-Sigma modulator according to an embodiment of the invention.

In order to describe the technology of the invention more clearly, it is assumed that the modulation value is M, the Delta-Sigma modulator 53 is an one-order Delta-Sigma modulator, and the one-order Delta-Sigma modulator is implemented by a K-bit accumulator, as shown in FIG. 7A. This means that the Delta-Sigma modulator 53 performs one accumulating operation each time when the modulation value generator 54 transfers the modulation value M to the Delta-Sigma modulator 53. When the accumulated value exceeds $2^K$, the Delta-Sigma modulator 53 will output the phase modulation value (i.e., "1"). When the phase modulator 52 receives the phase modulation value, it performs the phase advance or phase delay operation with respect to the oscillation clock signals. This way is utilized because it is not desired to continuously perform the phase advance or phase delay operation in a short period of time, which causes the frequency to change too severely. Consequently, the method of this embodiment utilizing the operation of the K-bit accumulator may evenly advance or delay the oscillation clock signals by M phases in $2^K$ clock cycles. According to the above-mentioned principle, if the value M is set to be 357, and the value of K is set to be 10, which means that the Delta-Sigma modulator 53 is a 10 bit accumulator, 357 carry values are generated in every 1024 clock cycles. In other words, after 1024 clock cycles have been elapsed, 357 phases have been advanced or delayed, and the value M may be generated by the modulation value generator 54. Controlling the modulation value (M) outputted from the modulation value generator 54 may control the average frequency of the modulation clock signals outputted from the phase modulator 52. Of course, controlling the modulation value generator 54 from the outside also may detect the average frequency of the modulation clock signals so as to determine the modulation value (M) that has to be outputted.

Taking the phase delay as an example, it is assumed that the period of the oscillation clock signals is $T_0$ and the oscillation clock signals has P phases in one clock cycle. The phase modulator 52 delays or shortens at least one phase each time it receives the phase modulation value. For example, if one phase is delayed, the time for delaying one phase is $T_0/P$. The following equations may be derived after $2^K$ clock cycles have been elapsed:

$$2^K * T' = 2^K * T_0 + \frac{M}{P} * T_0$$

$$T' = \frac{2^K * T_0 + \frac{M}{P} * T_0}{2^K} = \frac{2^K + \frac{M}{P}}{(2^K)} * T_0, \text{ and}$$

$$F' = \frac{1}{T'} = \frac{2^k}{\left(2^k + \frac{M}{P}\right) * T_0} = F_0 * \frac{2^K}{2^K + \frac{M}{P}} = F_0 * \frac{1}{1 + \frac{M}{2^K * P}},$$

wherein T' denotes the modulated average cycle, F' denotes the modulated average frequency, and $F_0$ denotes the frequency of the oscillation clock signals.

Figure 7B:
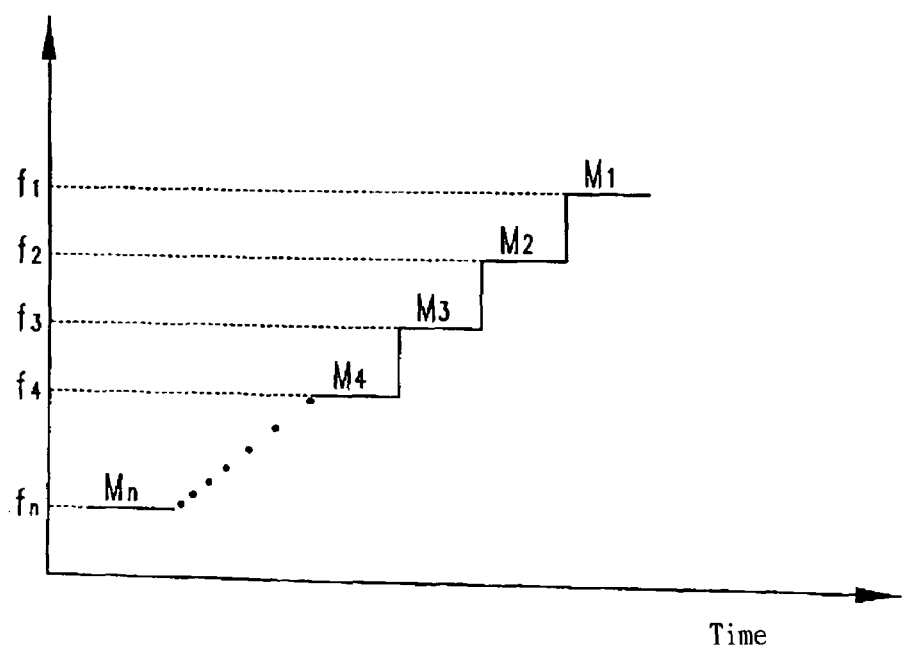
FIG. 7B shows a waveform of modulation values outputted from the modulation value generator of FIG. 5.

It can be understood, from the above-mentioned equations, that the average frequency of the modulation clock signals outputted from the phase modulator 52 will change with the variation of the value M after $2^K$ clock cycles have been elapsed. As the value M gets greater, the average frequency of the modulation clock signal gets lower. On the contrary, as the value M gets smaller, the average frequency of the modulation clock signal gets higher. According to the embodiment of the invention, it is to change the magnitude of the average frequency of the modulation clock signals by adjusting the value M, wherein different values M (e.g., $M_1, M_2, M_3, \ldots$) are utilized at different time intervals such that the average frequency of the modulation clock signals is continuously changing. In order to prevent the frequency from varying too severely, the invention utilizes the Delta-Sigma modulator 53 to diverge the phase modulation value and to make it evenly distributed over $2^K$ clock cycles so as to smoothen the frequency variation. The output waveform of the phase modulator 52 is illustrated in FIG. 7B, wherein $M_1<M_2<M_3<\ldots<M_n$. It can be understood, from FIG. 7B, that the average frequency of the modulation clock signals changes as the value M changes. Thus, adjusting the value M to change the average frequency of the modulation clock signals can achieve the object of spread spectrum of the oscillation clock signals.

Figure 8A:
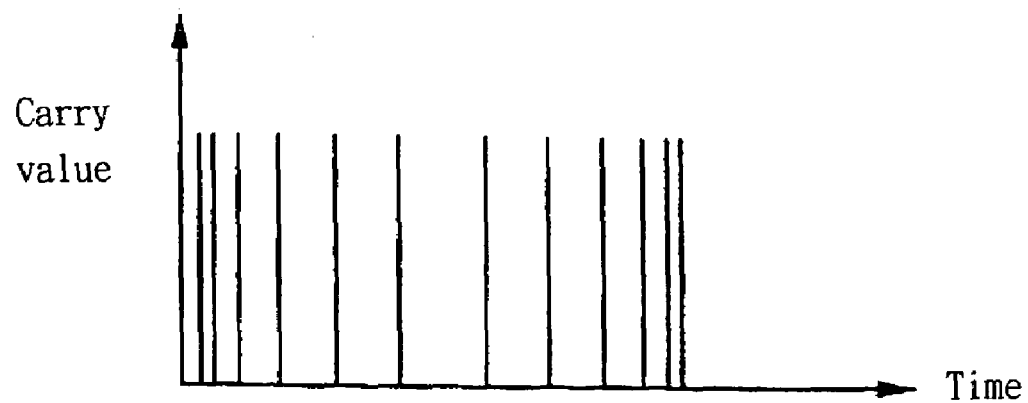
FIG. 8A shows an output waveform of the Delta-Sigma modulator of FIG. 5.
Figure 8B:
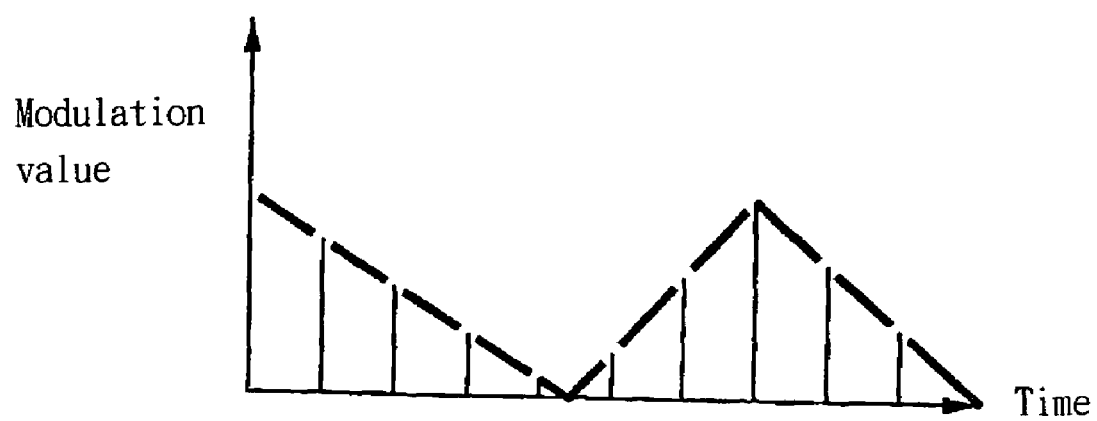
FIG. 8B shows an output waveform of the modulation value generator of FIG. 5.

FIGS. 8A and 8B show output waveforms of the Delta-Sigma modulator 53 and the modulation value generator 54. It is clear from the drawings that the density of the output waveform of the Delta-Sigma modulator 53 gets larger as the modulation value gets greater, this is because the phase modulation value generated by the Delta-Sigma modulator 53 gets larger as the value M gets larger. Thus, the circuit of the embodiment of the invention can perform not only the center spread spectrum but also the up/down spread spectrum.

Of course, if the modulation clock signal is desired to have a smaller period jitter, the second phase-locked loop 57 may be utilized to reduce the influence of the period jitter and thus to obtain a waveform having a smoother first spread spectrum signal. If the average frequency of the modulation clock signal is too great, the divider 55 may be utilized to divide the frequency and generate a divided clock signal having the desired frequency. Then, the divided clock signal passes through a third phase-locked loop 56, and a second spread spectrum signal is thus obtained.

Compared to the prior art, the invention has the following advantages.

1. It is unnecessary to add a modulation signal generator, which is for generating a modulation signal, to the PLL.

2. Because it is unnecessary to utilize a modulation signal in the PLL, the capacitor area of the loop filter in the PLL does not have to be enlarged, and the size of the circuit device may be effectively reduced.

3. The invention may perform the center spread spectrum as well as the single direction spread spectrum, such as the down spread spectrum, so it may be widely utilized.

4. Because it is unnecessary to utilize a modulation signal in the PLL, there is no problem of excessively converged energy, and the curve in the frequency spectrum chart may be smoother.

In summary, the spread spectrum circuit and method of the invention may effectively improve the conventional art drawbacks, so it may be used in the industry and achieve the object of the invention.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A clock generating circuit, comprising:
   a clock generator for receiving a reference clock signal and thereby generating an output clock signal; and
   a spread spectrum control circuit, coupled to the clock generator, for generating a modulated clock signal with a frequency variation according to the output clock signal and a modulation value, comprising:
      a modulation value generating circuit for outputting the modulation value; and
      a frequency control circuit, coupled to the clock generator and the modulation value generating circuit, for generating the modulated clock signal according to the output clock signal and the modulation value with which an average frequency of the modulated clock signal varies;
   wherein the modulation value varies with time in a predetermined manner so as to force the average frequency of the modulated clock signal to change up and down over time, the clock generator operates in a way being independent of the spread spectrum control circuit when the average frequency of the modulated clock signal changes up and down over time, and the output clock signal generated by the clock generator and the modulated signal generated by the spread spectrum control circuit are separate signals.

2. The clock generating circuit of claim 1, wherein the predetermined manner represents that the modulation value increases progressively in a first period of time and then decreases progressively in a second period of time so as to force the average frequency of the modulated clock signal to change over time.

3. The clock generating circuit of claim 1, wherein the modulation value generating circuit outputs the modulation value according to at least one of an external control and the average frequency of the modulated clock signal.

4. The clock generating circuit of claim 1, wherein the spread spectrum control circuit further comprises:
   a timing control circuit, coupled between the modulation value generating circuit and the frequency control circuit, for providing a frequency control value for the frequency control circuit according the modulation value after a predetermined period of time such that the average frequency of the modulated clock signal changes in accordance with the frequency control value after the predetermined period of time.

5. The clock generating circuit of claim 4, wherein the timing control circuit is a delta-sigma modulator.

6. The clock generating circuit of claim 1, wherein the clock generator is a multi-phase clock generator for generating the output clock signal including a plurality of oscillation clock signals having a same frequency but different phases.

7. The clock generating circuit of claim 6, wherein the frequency control circuit comprises:
   a phase interpolator, coupled to the clock generator, for generating a plurality of interpolation signals according to at least two of the oscillation clock signals; and
   a phase selector, coupled to the phase interpolator and the modulation value generating circuit, for receiving the plurality of interpolation signals and outputting one of them as the modulated clock signal according to the modulation value.

8. The clock generating circuit of claim 6, wherein the frequency control circuit comprises:
   a phase selector, coupled to the clock generator, for outputting at least two of the oscillation clock signals as selection signals; and a phase interpolator, coupled to the phase selector, for generating the modulated clock signal according to the selection signals;

wherein at least one of the phase selector and the phase interpolator operates according to the modulation value.

9. The clock generating circuit of claim 1, further comprising:

at least one spread spectrum clock signal generator, coupled to the spread spectrum control circuit, for generating a spread spectrum clock signal in accordance with the modulated clock signal;

wherein the spread spectrum clock signal, the output clock signal and the modulated clock signal are separate signals.

10. A clock generating method, comprising:

generating an output clock signal according to a reference clock signal; and executing a spread spectrum control step for generating a modulated clock signal with a frequency variation according to the output clock signal and a modulation value, the spread spectrum control step comprising:

generating the modulation value; and generating the modulated clock signal according to the output clock signal and the modulation value with which an average frequency of the modulated clock signal varies;

wherein the modulation value varies with time in a redetermined manner so as to force the average frequency of the modulated clock signal to change up and down over time, the output clock signal is generated in a way being independent of the spread spectrum control step when the average frequency of the modulated clock signal changes up and down, and the output clock signal and the modulated clock signal are separate signals.

11. The clock generating method of claim 10, wherein the predetermined manner represents that the modulation value increases progressively in a first period of time and then decreases progressively in a second period of time so as to force the average frequency of the modulated clock signal to change over time.

12. The clock generating method of claim 10, wherein the step of generating the modulation value is executed according to at least one of an external control and the average frequency of the modulated clock signal.

13. The clock generating method of claim 10, wherein the spread spectrum control step further comprises:

generating a frequency control value according the modulation value after a predetermined period of time such that the average frequency of the modulated clock signal changes in accordance with the frequency control value after the predetermined period of time.

14. The clock generating method of claim 10, wherein the output clock signal includes a plurality of oscillation clock signals having a same frequency but different phases.

15. The clock generating method of claim 14, wherein the step of generating the modulated clock signal comprises:

generating a plurality of interpolation signals according to at least two of the oscillation clock signals; and receiving the plurality of interpolation signals and outputting one of them as the modulated clock signal according to the modulation value.

16. The clock generating method of claim 14, wherein the step of generating the modulated clock signal comprises:

receiving the oscillation clock signals and outputting at least two of them as selection signals; and generating the modulated clock signal according to the selection signals;

wherein at least one of the step outputting the selection signals and the step of generating the modulated clock signal according to the selection signals is executed according to the modulation value.

17. The clock generating method of claim 10, further comprising:

generating a spread spectrum clock signal in accordance with the modulated clock signal;

wherein the spread spectrum clock signal, the output clock signal and the modulated clock signal are separate signals.

* * * * *